US008338902B2

(12) United States Patent
Kwon et al.

(10) Patent No.: US 8,338,902 B2
(45) Date of Patent: Dec. 25, 2012

(54) UNCOOLED INFRARED IMAGE SENSOR

(75) Inventors: Honam Kwon, Kawasaki (JP); Hideyuki Funaki, Tokyo (JP); Hiroto Honda, Yokohama (JP); Hitoshi Yagi, Yokohama (JP); Ikuo Fujiwara, Yokohama (JP); Masaki Atsuta, Yokosuka (JP); Kazuhiro Suzuki, Tokyo (JP); Keita Sasaki, Yokohama (JP); Koichi Ishii, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 13/050,512

(22) Filed: Mar. 17, 2011

(65) Prior Publication Data
US 2012/0049313 A1    Mar. 1, 2012

(30) Foreign Application Priority Data
Aug. 24, 2010   (JP) .................................. 2010-187405

(51) Int. Cl.
H01L 31/024 (2006.01)
(52) U.S. Cl. . 257/446; 257/466; 257/735; 257/E31.038; 257/E31.131
(58) Field of Classification Search .................. 257/446, 257/466, 735, E31.038, E31.131
See application file for complete search history.

(56) References Cited

U.S. PATENT DOCUMENTS

| 6,759,657 B2 * | 7/2004 | Iida et al. ....................... 250/332 |
| 7,943,905 B2 * | 5/2011 | Honda et al. .................. 250/332 |
| 8,067,740 B2 * | 11/2011 | Sasaki et al. ................ 250/338.4 |
| 2004/0108460 A1 * | 6/2004 | Iida et al. ....................... 250/332 |
| 2010/0230594 A1 * | 9/2010 | Honda et al. .................. 250/332 |
| 2011/0228809 A1 * | 9/2011 | Tadigadapa ..................... 374/31 |

FOREIGN PATENT DOCUMENTS

| JP | 2001-264158 A | 9/2001 |
| JP | 2005-64999 A | 3/2005 |
| JP | 2009-133825 A | 6/2009 |
| JP | 2010-32410 | 2/2010 |

OTHER PUBLICATIONS

U.S. Appl. No. 13/247,025, filed Sep. 28, 2011, Honda et al.
Office Action issued Jul. 6, 2012, in Japanese Patent Application No. 2010-187405 with English-language translation.

* cited by examiner

Primary Examiner — George Fourson, III
(74) Attorney, Agent, or Firm — Oblon, Spivak, McClelland, Maier & Neustadt, L.L.P.

(57) ABSTRACT

An uncooled infrared image sensor according to an embodiments includes: a plurality of pixel cells formed in a first region on a semiconductor substrate; a reference pixel cell formed in a second region on the semiconductor substrate and corresponding to each row or each column of the pixel cells; a supporting unit formed for each of the pixel cell and supporting a corresponding pixel cell; and an interconnect unit formed for each reference pixel cell. Each of the pixel cells includes: a first infrared absorption film and a first heat sensitive element. The reference pixel cell includes: a second infrared absorption film and a second heat sensitive element, the second heat sensitive element having the same characteristics as characteristics of the first heat sensitive element. The third and fourth interconnects of the interconnect unit have the same electrical resistance as electrical resistance of the first and second interconnects of the supporting unit.

14 Claims, 11 Drawing Sheets

UNCOOLED INFRARED IMAGE SENSOR

CROSS-REFERENCE TO RELATED APPLICATION

This application is based upon and claims the benefit of priority from prior Japanese Patent Application No. 2010-187405 filed on Aug. 24, 2010 in Japan, the entire contents of which are incorporated herein by reference.

FIELD

Embodiments described herein relate generally to an uncooled infrared image sensor.

BACKGROUND

Normally, an uncooled infrared image sensor has concave portions below a diode array forming pixel units, so as to increase its sensitivity. As the substrate temperature varies, temperature corrections are performed on the pixel units. To perform the temperature corrections, reference pixel units having heat sensitive elements formed on the substrate are placed in the vicinities of the pixel units. The I-V characteristics (current-voltage characteristics) of the reference pixel units are utilized to detect variations in the substrate temperature. In this manner, temperature corrections are performed on the pixel units.

However, the reference pixel units have different I-V characteristics from those of the pixel units, because of their structural differences from the pixel units. Therefore, accurate temperature corrections cannot be performed on the pixel units.

DETAILED DESCRIPTION

Figure 1:
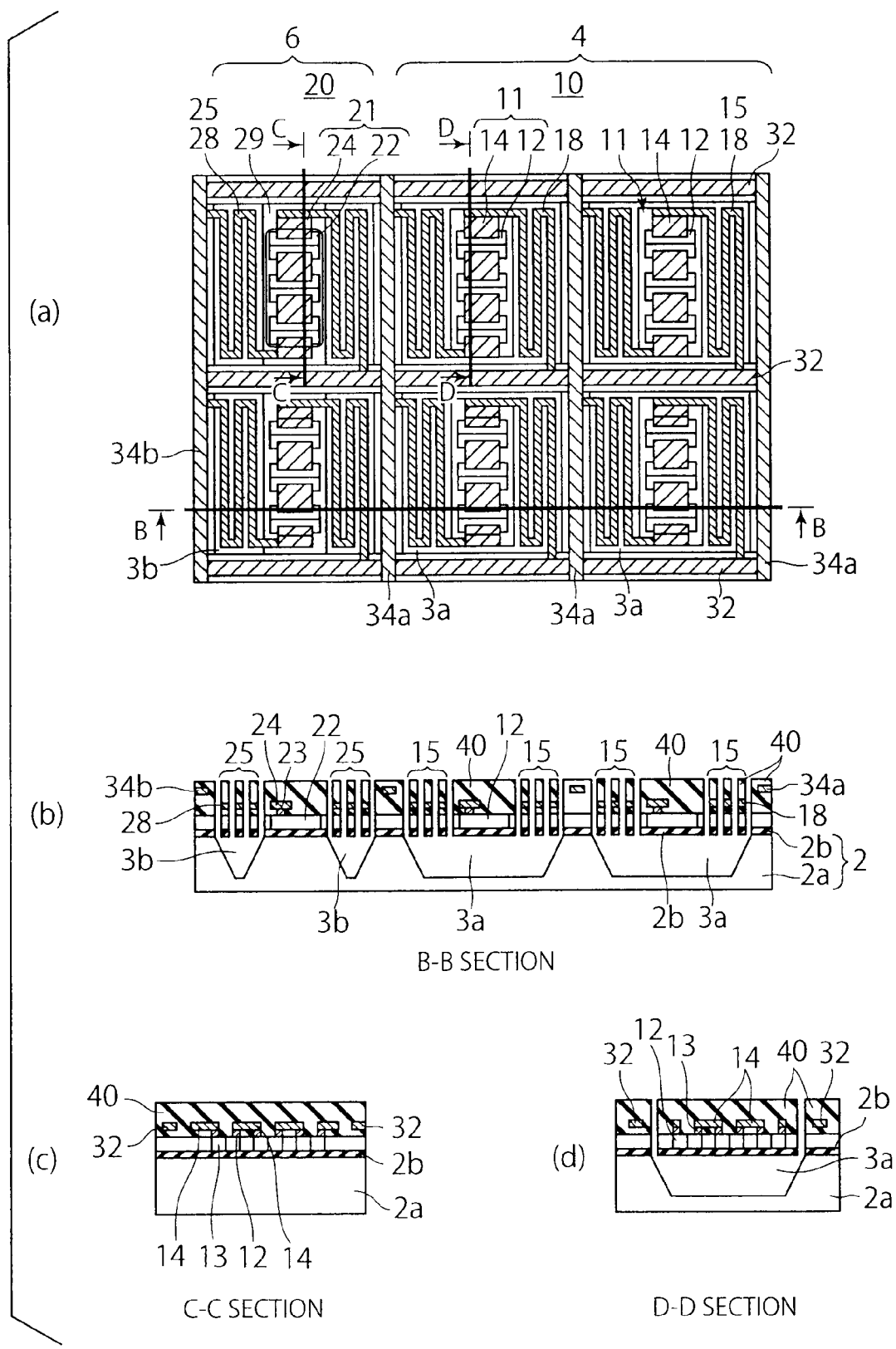
FIGS. 1(a) through 1(d) are diagrams showing an uncooled infrared image sensor according to a first embodiment.

The following is a description of embodiments, with reference to the accompanying drawings. In the respective drawings, components having the same or similar functions are denoted by like reference numerals, and the same explanation will not be repeated more than once in the following description.

An uncooled infrared image sensor according to an embodiment includes: a semiconductor substrate; a plurality of pixel cells formed in a first region on the semiconductor substrate, the first region having first concave portions arranged in a matrix form in a surface of the semiconductor substrate, the pixel cells corresponding to the arrangement of the first concave portions and being located above the first concave portions, each of the pixel cells including: a first infrared absorption film absorbing an incident infrared ray and converting the absorbed infrared ray into heat; and a first heat sensitive element generating an electrical signal by detecting the heat from the first infrared absorption film; a reference pixel cell formed in a second region on the semiconductor substrate and corresponding to each row or each column of the pixel cells, the reference pixel cell including: a second infrared absorption film absorbing an incident infrared ray and converting the absorbed infrared ray into heat; and a second heat sensitive element generating an electrical signal by detecting the heat from the second infrared absorption film, the second heat sensitive element having the same characteristics as characteristics of the first heat sensitive element; a supporting unit formed for each of the pixel cell and supporting a corresponding pixel cell above the first concave portions, the supporting unit including: a first interconnect having one end connected to one end of the first heat sensitive element; and a second interconnect having one end connected to the other end of the first heat sensitive element; and an interconnect unit formed for each reference pixel cell, the interconnect unit including: a third interconnect having one end connected to one end of the second heat sensitive element; and a fourth interconnect having one end connected to the other end of the corresponding second heat sensitive element. The third and fourth interconnects of the interconnect unit have the same electrical resistance as electrical resistance of the first and second interconnects, the reference pixel cell is in contact with the semiconductor substrate, a second concave portion is formed below the interconnect unit and is located in the surface of the semiconductor substrate.

First Embodiment

An uncooled infrared image sensor of a first embodiment is shown in FIGS. 1(a), 1(b), 1(c), and 1(d). FIG. 1(a) is a plan view of the uncooled infrared image sensor according to this embodiment. FIG. 1(b) is a cross-sectional view of the uncooled infrared image sensor, taken along the section line B-B of FIG. 1(a). FIG. 1(c) is a cross-sectional view of the uncooled infrared image sensor, taken along the section line C-C of FIG. 1(a). FIG. 1(d) is a cross-sectional view of the uncooled infrared image sensor, taken along the section line D-D of FIG. 1(a). It should be noted that, in FIG. 1(a), the later described infrared absorption film is not shown.

The uncooled infrared image sensor according to this embodiment is formed on a SOI substrate 2 including a supporting substrate 2a, a buried insulating film 2b, and a SOI (Silicon On Insulator) layer. The uncooled infrared image sensor includes pixel units 10 that are formed in a pixel formation region 4 of the SOI substrate 2 and are arranged in a matrix form, and reference pixel units 20 formed in a reference pixel formation region 6 of the SOI substrate 2. The reference pixel units 20 are arranged along a column of the pixel units 10 arranged in a matrix form, and at least one reference pixel unit 20 is provided for each row. That is, the pixel units 10 and the reference pixel units 20 are arranged in a matrix form. Although at least one reference pixel unit 20 is provided for each row in this embodiment, at least one reference pixel unit 20 may be provided for each column.

Row select lines 32 are provided for the respective rows in the row direction, and signal lines 34a and 34b are provided for the respective columns in the column direction. Each of the row select lines 32 is used to select the pixel units 10 and the reference pixel unit 20 of each corresponding row. Each of the signal lines 34a is used to read signals from the pixel units 10 arranged along the same column, and the signal line 34b is used to read signals from the reference pixel units 20. Where at least one reference pixel unit 20 is provided for each column, a reference pixel row select line (not shown) for selecting the row formed only by the reference pixel units 20 needs to be provided as well as the above described row select lines 32. In that case, the signal line 34b for reading signals from the reference pixel units 20 is unnecessary, and each of the signal lines 34a is also used to read a signal from the reference pixel unit 20 of each corresponding column.

Each of the pixel units 10 includes a pixel cell 11 formed above a hollow portion 3a formed in the surface of the supporting substrate 2a, and supporting units 15 supporting the pixel cell 11 above the hollow portion 3a. The pixel cell 11 is formed on the buried insulating film 2b, and includes heat sensitive elements 12 (three in FIG. 1(a)) connected in series, contacts 13, and interconnects 14 connecting the heat sensitive elements 12 in series. The heat sensitive elements 12 and the interconnects 14 are electrically connected by the contacts 13. In this embodiment, the heat sensitive elements 12 are diodes formed by pn junctions formed on the SOI layer, but may be resistive elements having resistances varied with heat, instead. In each pixel cell 11, the heat sensitive elements 12 and the interconnects 14 are covered with an infrared absorption film 40. The supporting units 15 has two interconnects 18, and those interconnects 18 are covered with the infrared absorption film 40. One of the two interconnects 18 has one end connected to one end of a series circuit formed by the series-connected heat sensitive elements 12, and has the other end connected to the row select line 32. The other one of the two interconnects 18 has one end connected to the other end of the series circuit, and has the other end connected to the signal line 34a. In each pixel cell 11, there exists the two supporting units 15 for supporting the two ends of the pixel cell 11. However, the supporting units may be a single structure that supports only one end of the pixel cell 11. In that case, two separated interconnects are formed in the single supporting unit, and electrically connect the series circuit, the row select line 32, and the signal line 34a.

Each of the reference pixel units 20 includes a reference pixel cell 21 formed above the supporting substrate 2a via the buried insulating film 2b, and interconnect units 25 connecting the reference pixel cell 21, the corresponding row select line 32, and the signal line 34b. The reference pixel cell 21 is formed on the buried insulating film 2b, and includes heat sensitive elements 22 (three heat sensitive elements in FIG. 1(a)) connected in series, and interconnects 24 connecting the heat sensitive elements 22 in series. Unlike each pixel cell 11, the reference pixel cell 21 does not have a hollow portion in the supporting substrate 2a existing below the reference pixel cell 21. Accordingly, in the reference pixel cell 21, the portions 29 at both ends in the direction in which the heat sensitive elements 22 are connected in series are connected to the supporting substrate 2a. As a result, the heat conductance in the reference pixel cell 21 becomes higher than that in each pixel cell 11. Since the heat sensitive elements 22 and the interconnects 24 of the reference pixel cell 21 are manufactured through the same manufacturing procedures as those for manufacturing the heat sensitive elements 12 and the interconnects 14, the heat sensitive elements 22 have substantially the same I-V characteristics as those of the heat sensitive elements 12, and the interconnects 24 also have the same electrical characteristics as those of the interconnects 14. The heat sensitive elements 22 and the interconnects 24 are also covered with the infrared absorption film 40, like the pixel units 11.

Each of the interconnect units 25 has two interconnects 28, and those interconnects 28 are covered with the infrared absorption film 40. One of the two interconnects 28 has one end connected to one end of a series circuit formed by the series-connected heat sensitive elements 22, and has the other end connected to the corresponding row select line 32. The other one of the two interconnects 28 has one end connected to the other end of the series circuit, and has the other end connected to the signal line 34b. Each of the two interconnects 28 is designed to have the same shape, length, and electrical resistance as those of each of the two interconnects 18 of each supporting unit 15 of the pixel cell 11. Further, like each supporting unit 15, each interconnect unit 25 has a concave portion 3b formed in the surface of the supporting substrate 2a located below the interconnect unit 25.

Figure 2:
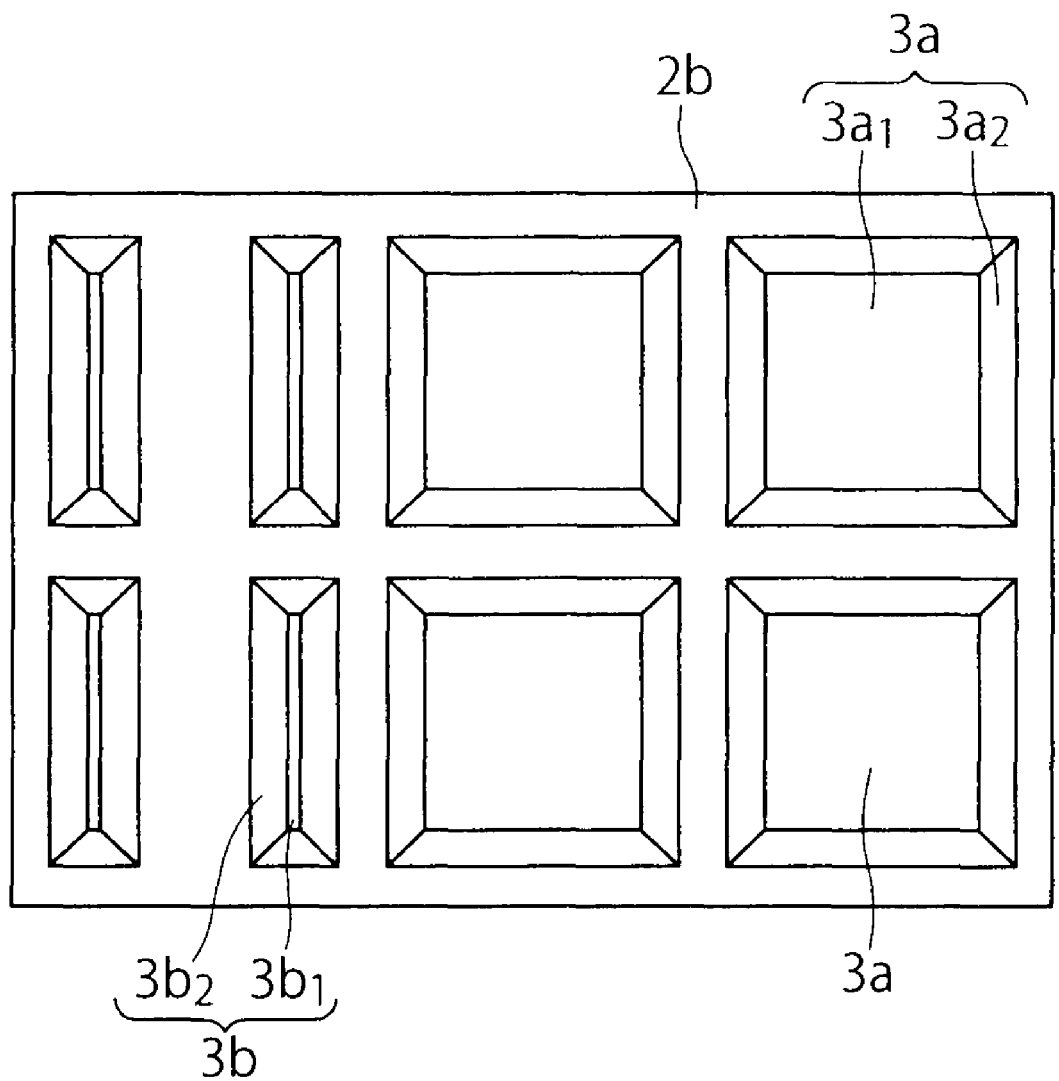
FIG. 2 is a plan view of the supporting substrate of the uncooled infrared image sensor according to the first embodiment.

FIG. 2 shows the planar shapes of the concave portions 3a and 3b formed in the surface of the supporting substrate 2a. FIG. 2 is a plan view of the supporting substrate 2a minus the pixel units 10 and the reference pixel units 20. Each concave portion 3a is formed by a bottom face $3a_1$, and side faces $3a_2$ connecting the bottom face $3a_1$ and the upper face of the supporting substrate 2a. Each concave portion 3b is formed by a bottom face $3b_1$, and side faces $3b_2$ connecting the bottom face $3b_1$ and the upper face of the supporting substrate 2a. In this embodiment, the bottom face $3a_1$ has a substantially square shape, and the bottom face $3b_1$ has a substantially rectangular shape. The long axis of the bottom face $3b_1$ extends in the direction in which the heat sensitive elements 22 are connected in series.

In the infrared image sensor of this embodiment having the above structure, infrared rays entering the infrared image sensor are absorbed and converted into heat by the infrared absorption film 40, and the heat is transmitted to the heat sensitive elements 12 and 22, which convert the heat into electrical signals (voltages). The concave portions 3a are formed in the surface of the supporting substrate 2a located below the heat sensitive elements 12 of the pixel cells 11, and the heat sensitive elements 12 are supported above the concave portions 3a by the supporting units 15 and substantially thermally insulated from the supporting substrate 2a. Accordingly, the heat sensitive elements 12 generate an electrical signal, based on the heat generated from the infrared absorption film 40 based on the infrared rays entering each corresponding pixel cell 11.

Meanwhile, each of the reference pixel cells 21 does not have a concave portion 3a formed in the surface of the supporting substrate 2a located below the reference pixel cells 21, and is formed above the supporting substrate 2a via the buried insulating film 2b. With this arrangement, the heat generated in the infrared absorption film 40 from the incident infrared rays is transmitted via the substrate. Accordingly, an electrical signal detected by the heat sensitive elements 22 represent the temperature of the substrate.

Since each interconnect unit 25 has the same structure as each supporting unit 15 of the pixel cells 11, each interconnect 28 of the interconnect units 25 has the same electrical resistance as that of each interconnect 18 of the supporting units 15. Also, concave portions are formed below the interconnect units 25, like the concave portions below the supporting units 15. Accordingly, the influence of the interconnect units 25 on the heat sensitive elements 22 is the same as the influence of the supporting units 15 on the heat sensitive elements 12.

That is, the pixel cells 11 and the reference pixel cells 21 have substantially the same I-V characteristics, and temperature corrections can be more accurately performed on the pixel units 10.

Second Embodiment

Figure 3:
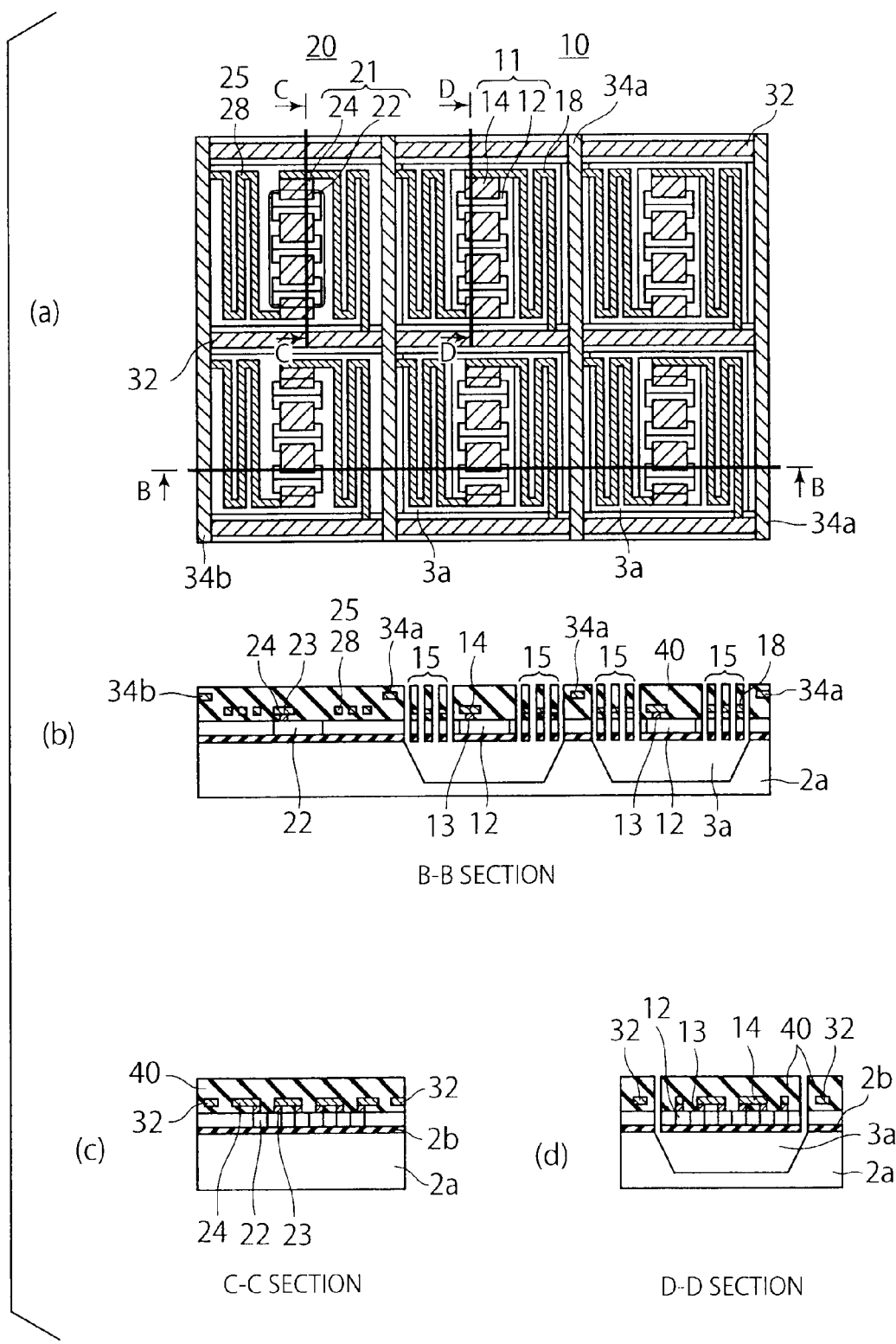
FIGS. 3(a) through 3(d) are diagrams showing an uncooled infrared image sensor according to a second embodiment.

An uncooled infrared image sensor of a second embodiment is shown in FIGS. 3(*a*), 3(*b*), 3(*c*), and 3(*d*). FIG. 3(*a*) is a plan view of the uncooled infrared image sensor according to this embodiment. FIG. 3(*b*) is a cross-sectional view of the uncooled infrared image sensor, taken along the section line B-B of FIG. 3(*a*). FIG. 3(*c*) is a cross-sectional view of the uncooled infrared image sensor, taken along the section line C-C of FIG. 3(*a*). FIG. 3(*d*) is a cross-sectional view of the uncooled infrared image sensor, taken along the section line D-D of FIG. 3(*a*). It should be noted that, in FIG. 3(*a*), the infrared absorption film 40 is not shown.

The uncooled infrared image sensor according to this embodiment is the same as that of the first embodiment shown in FIGS. 1(*a*), 1(*b*), 1(*c*), and 1(*d*), except that the concave portions 3*b* are not formed below the interconnect units 25 of the reference pixel units 20. Therefore, the heat conductance of the reference pixel cell 21 is higher than the reference pixel cells of the first embodiment. In this embodiment, the interconnect units are formed only by the interconnects 28, and the interconnects 28 are covered with the infrared absorption film 40.

In this embodiment, each reference pixel cell 21 also has the same structure as each pixel cell 11, and each interconnect 28 of the interconnect units 25 also has the same electrical resistance as that of each interconnect 18 of the supporting units 15. Accordingly, the pixel cells 11 and the reference pixel cells 21 have substantially the same I-V characteristics, and temperature corrections can be more accurately performed on the pixel units 10.

Third Embodiment

Figure 4:
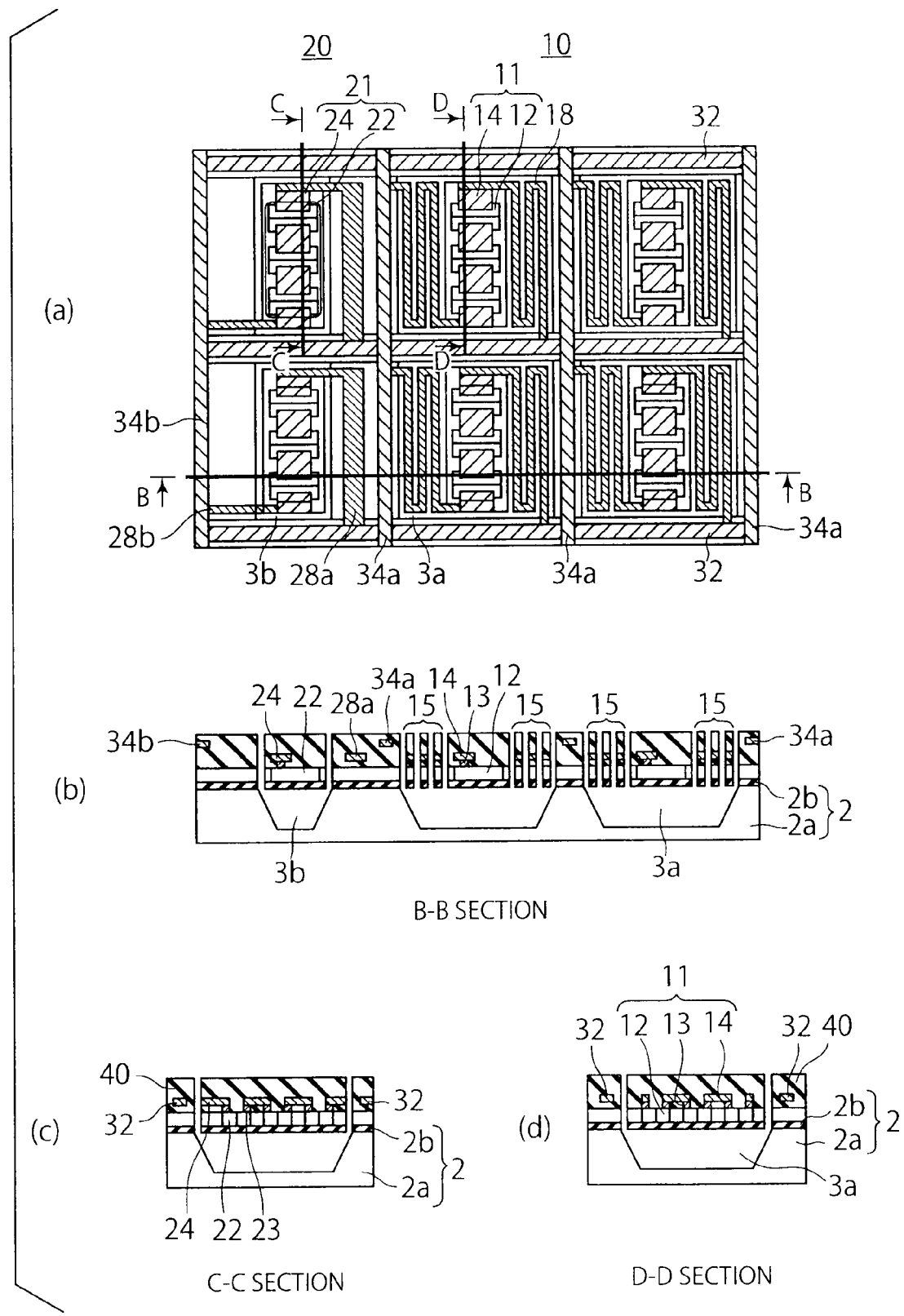
FIGS. 4(a) through 4(d) are diagrams showing an uncooled infrared image sensor according to a third embodiment.
Figure 5:
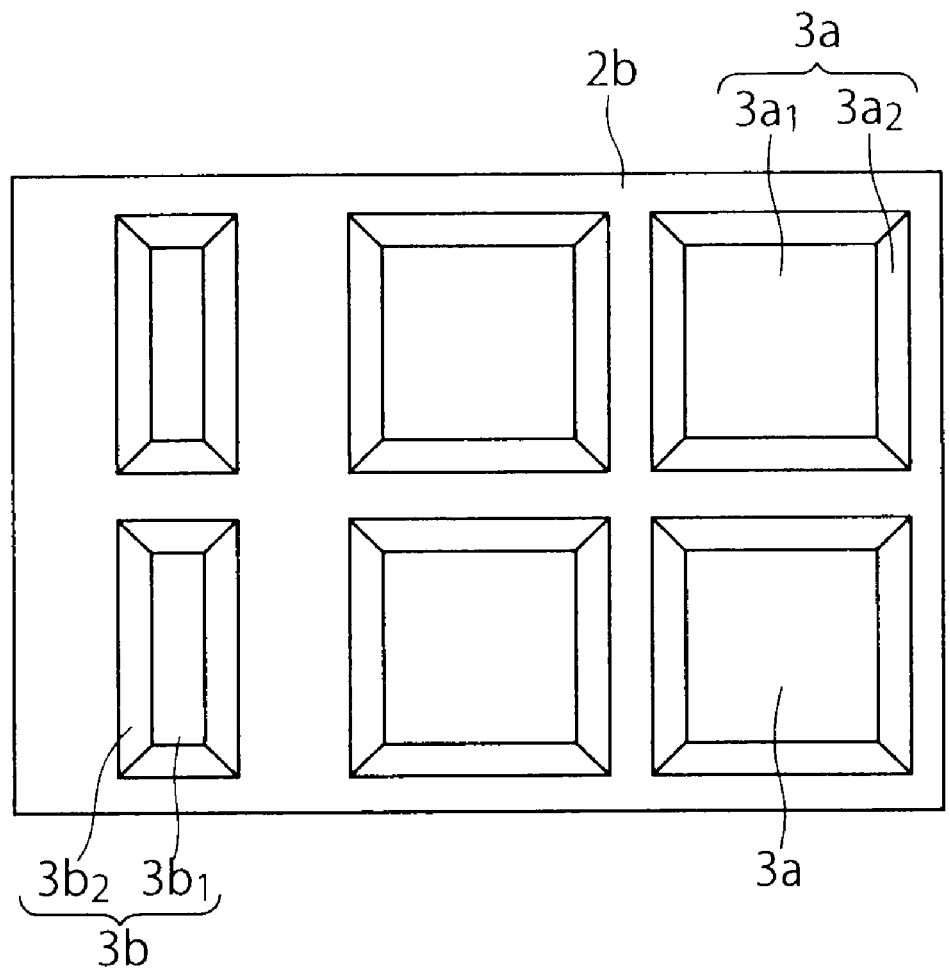
FIG. 5 is a plan view of the supporting substrate of the uncooled infrared image sensor according to the third embodiment.

An uncooled infrared image sensor of a third embodiment is shown in FIGS. 4(*a*), 4(*b*), 4(*c*), and 4(*d*), and FIG. 5. FIG. 4(*a*) is a plan view of the uncooled infrared image sensor according to this embodiment. FIG. 4(*b*) is a cross-sectional view of the uncooled infrared image sensor, taken along the section line B-B of FIG. 4(*a*). FIG. 4(*c*) is a cross-sectional view of the uncooled infrared image sensor, taken along the section line C-C of FIG. 4(*a*). FIG. 4(*d*) is a cross-sectional view of the uncooled infrared image sensor, taken along the section line D-D of FIG. 4(*a*). It should be noted that, in FIG. 4(*a*), the infrared absorption film 40 is not shown.

FIG. 5 is a plan view of the supporting substrate minus the pixel units and the reference pixel units.

The uncooled infrared image sensor according to this embodiment is the same as that of the first embodiment shown in FIGS. 1(*a*), 1(*b*), 1(*c*), and 1(*d*), except that the concave portions 3*b* are formed below the reference pixel cells 21 and in the surface of the supporting substrate 2*a* (see FIGS. 4(*a*) and 4(*b*), and FIG. 5), and concave portions are not formed below the interconnect units 25. Further, the interconnects 28 are replaced with interconnects 28*a* and 28*b*. Each interconnect 28*a* connects one end of the series circuit formed by the heat sensitive elements 22 of the reference pixel cells 21 to each corresponding row select line 32, and each interconnect 28*b* connects the other end of the series circuit formed by the heat sensitive elements 22 of the reference pixel cells 21 to each corresponding signal line 34.

In this embodiment, each reference pixel cell 21 has the same structure as each pixel cell 11, and the concave portions 3*b* are also formed below the reference pixel cells 21, like the concave portions 3*a* below the pixel cells 11. Accordingly, the pixel cells 11 and the reference pixel cells 21 have substantially the same I-V characteristics, and temperature corrections can be more accurately performed on the pixel units 10.

Fourth Embodiment

Figure 6:
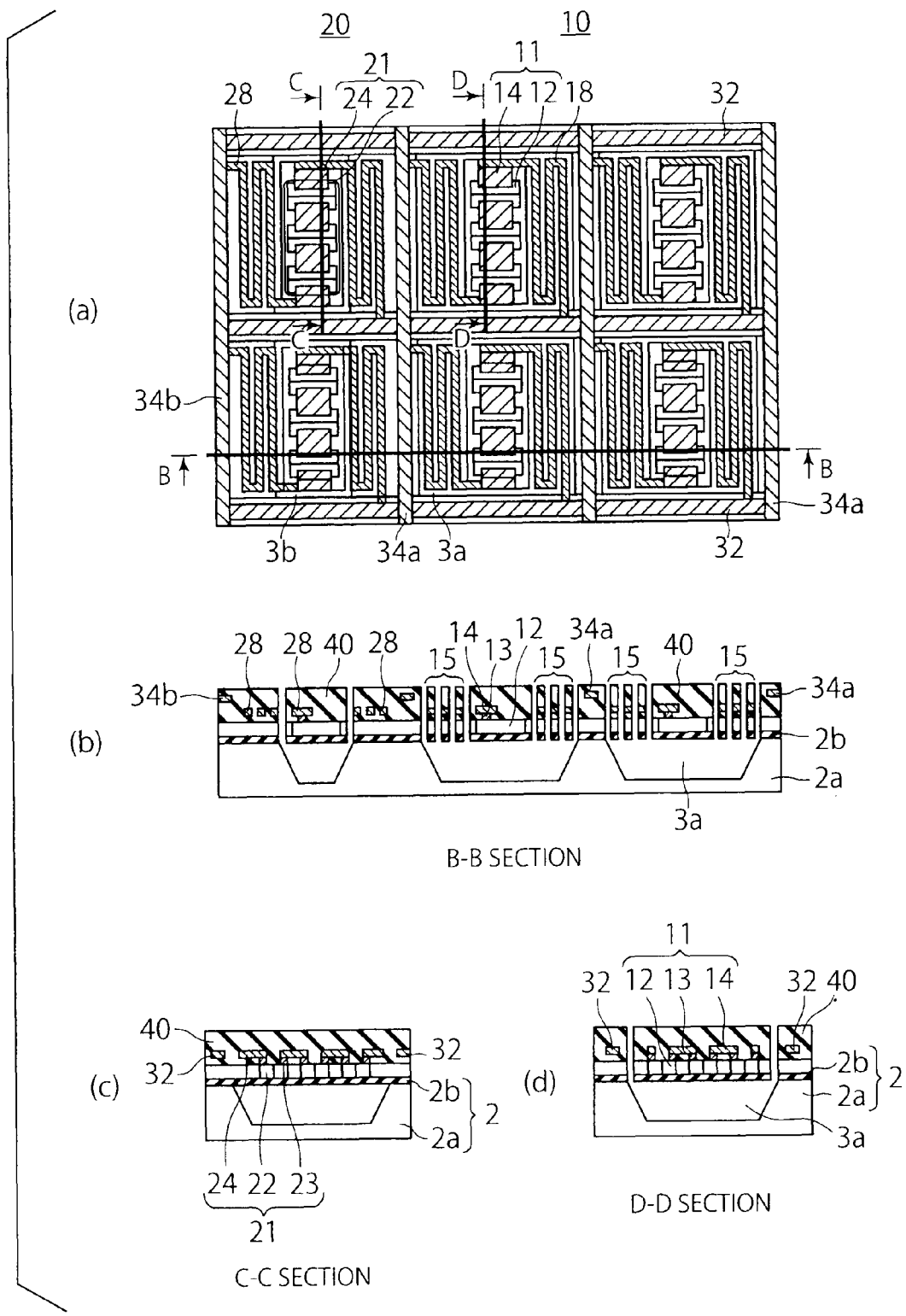
FIGS. 6(a) through 6(d) are diagrams showing an uncooled infrared image sensor according to a fourth embodiment.
Figure 7:
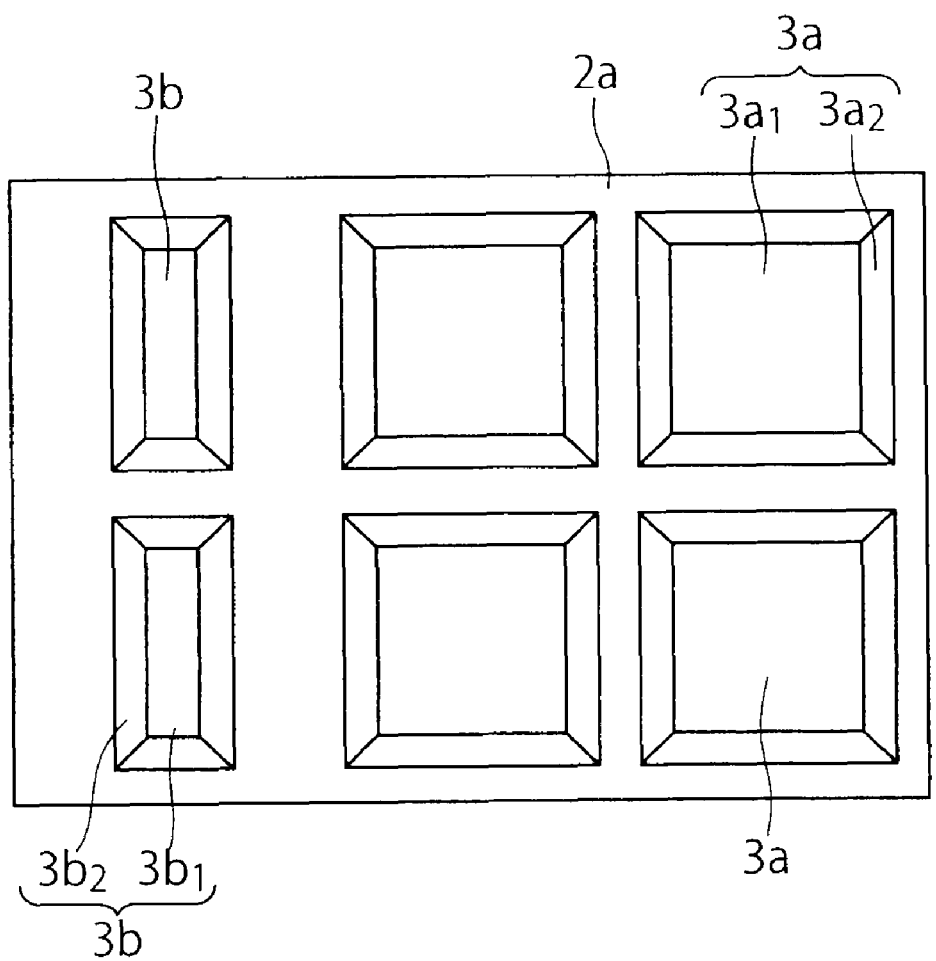
FIG. 7 is a plan view of the supporting substrate of the uncooled infrared image sensor according to the fourth embodiment.

An uncooled infrared image sensor of a fourth embodiment is shown in FIGS. 6(*a*), 6(*b*), 6(*c*), and 6(*d*), and FIG. 7. FIG. 6(*a*) is a plan view of the uncooled infrared image sensor according to this embodiment. FIG. 6(*b*) is a cross-sectional view of the uncooled infrared image sensor, taken along the section line B-B of FIG. 6(*a*). FIG. 6(*c*) is a cross-sectional view of the uncooled infrared image sensor, taken along the section line C-C of FIG. 6(*a*). FIG. 6(*d*) is a cross-sectional view of the uncooled infrared image sensor, taken along the section line D-D of FIG. 6(*a*). It should be noted that, in FIG. 6(*a*), the infrared absorption film 40 is not shown.

FIG. 7 is a plan view of the supporting substrate minus the pixel units and the reference pixel units.

The uncooled infrared image sensor according to this embodiment is the same as that of the first embodiment shown in FIGS. 1(*a*), 1(*b*), 1(*c*), and 1(*d*), except that the concave portions 3*b* are formed below the reference pixel cells 21 and in the surface of the supporting substrate 2*a* (see FIGS. 6(*a*) and 6(*b*), and FIG. 7), and concave portions are not formed below the interconnect units 25.

In this embodiment, each reference pixel cell 21 has the same structure as each pixel cell 11, each interconnect 28 of the interconnect units 25 has the same electrical resistance as that of each interconnect 18 of the supporting units 15, and the concave portions 3*b* are also formed below the reference pixel cells 21, like the concave portions 3*b* below the pixel cells 11. Accordingly, the pixel cells 11 and the reference pixel cells 21 have substantially the same I-V characteristics, and temperature corrections can be more accurately performed on the pixel units 10.

Fifth Embodiment

Figure 8:
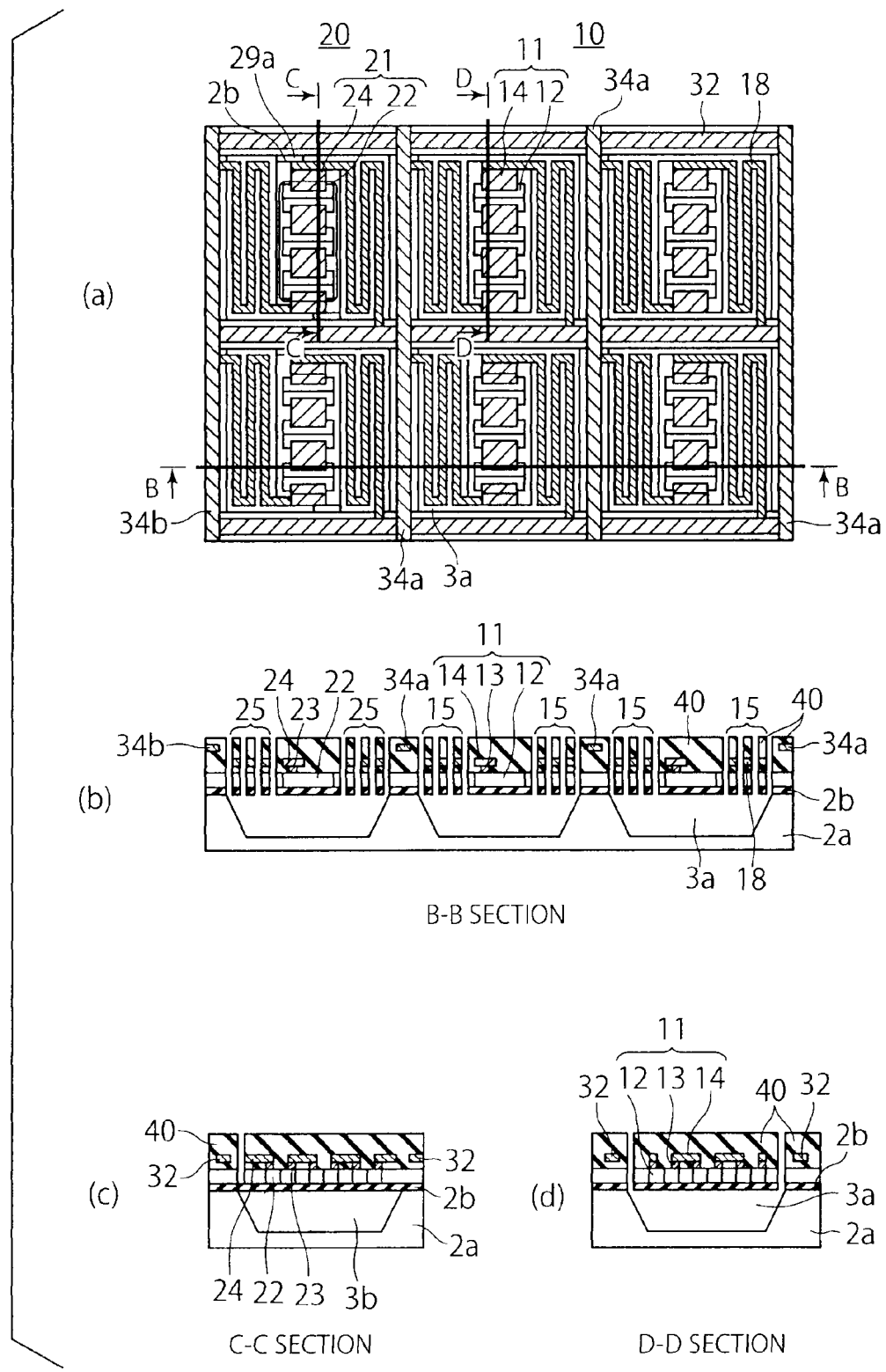
FIGS. 8(a) through 8(d) are diagrams showing an uncooled infrared image sensor according to a fifth embodiment.
Figure 9:
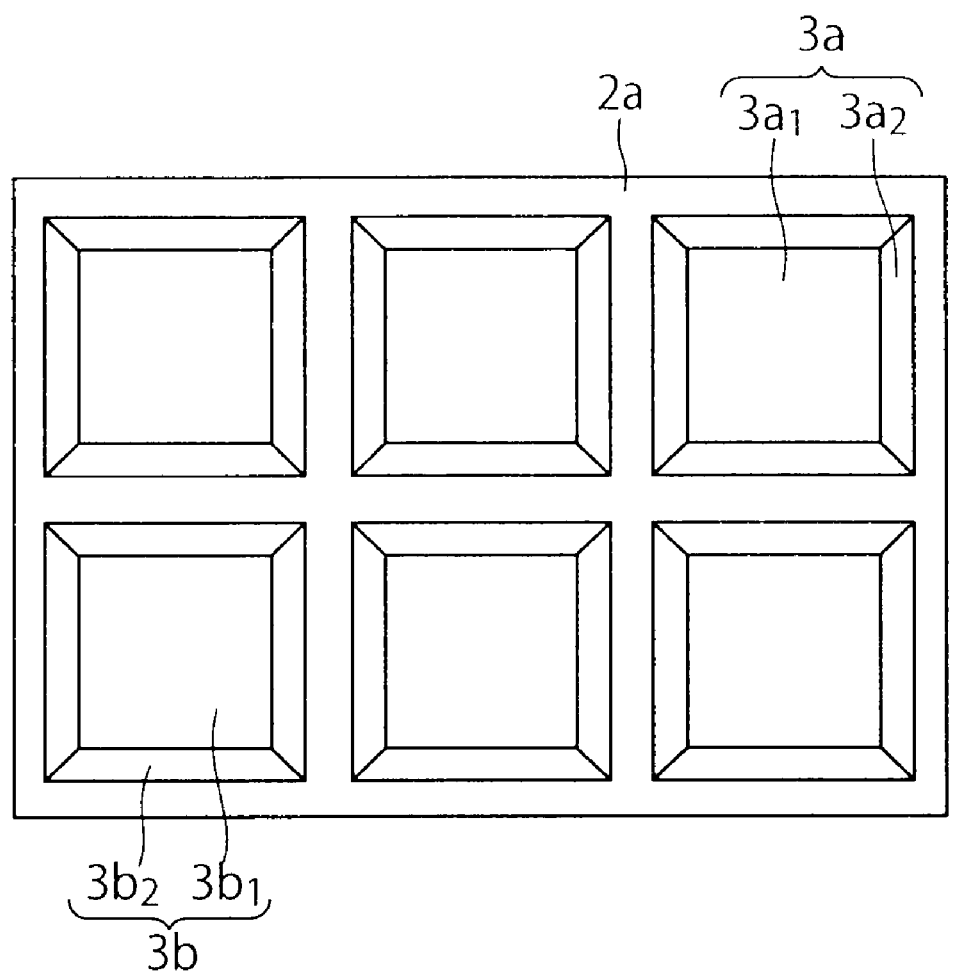
FIG. 9 is a plan view of the supporting substrate of the uncooled infrared image sensor according to the fifth embodiment.

An uncooled infrared image sensor of a fifth embodiment is shown in FIGS. 8(*a*), 8(*b*), 8(*c*), and 8(*d*), and FIG. 9. FIG. 8(*a*) is a plan view of the uncooled infrared image sensor according to this embodiment. FIG. 8(*b*) is a cross-sectional view of the uncooled infrared image sensor, taken along the section line B-B of FIG. 8(*a*). FIG. 8(*c*) is a cross-sectional view of the uncooled infrared image sensor, taken along the section line C-C of FIG. 8(*a*). FIG. 8(*d*) is a cross-sectional view of the uncooled infrared image sensor, taken along the section line D-D of FIG. 8(*a*). It should be noted that, in FIG. 8(*a*), the infrared absorption film 40 is not shown.

FIG. 9 is a plan view of the supporting substrate minus the pixel units and the reference pixel units.

The uncooled infrared image sensor according to this embodiment is the same as that of the first embodiment shown in FIGS. 1(a), 1(b), 1(c), and 1(d), except that concave portions 3b connected to the concave portions located below the interconnect units 25 and having the same size as that of the concave portions 3a of the pixel units 10 are formed below the reference pixel cells 21 and in the surface of the supporting substrate 2a (see FIGS. 8(a) and 8(b), and FIG. 9). That is, like the supporting units 15 of the first embodiment, the interconnect units 25 of this embodiment serve to support the reference pixel cells 21 above the concave portions 3b.

In each of the reference pixel cells 21, both ends in the direction in which the heat sensitive elements 22 are connected in series are connected to the supporting substrate 2a via the buried insulating film 2b. That is, heat-conducting bridges 29a formed by the buried insulating film 2b are formed between the respective reference pixel cells 21 and the supporting substrate 2a. Accordingly, the heat conductance becomes higher than that of the pixel cells 11.

In this embodiment, each reference pixel cell 21 has the same structure as each pixel cell 11, each interconnect 28 of the interconnect units 25 has the same electrical resistance as that of each interconnect of the supporting units 15, and the concave portions 3b are also formed below the reference pixel cells 21 and the interconnect units 25, like the concave portions 3b below the pixel cells 11. Accordingly, the pixel cells 11 and the reference pixel cells 21 have substantially the same I-V characteristics, and temperature corrections can be more accurately performed on the pixel units 10.

Sixth Embodiment

Referring now to FIGS. 10(a) through 10(d), a method of manufacturing an uncooled infrared image sensor according to a sixth embodiment is described. This embodiment concerns a method of manufacturing the uncooled infrared image sensor of the first embodiment.

Figure 10:
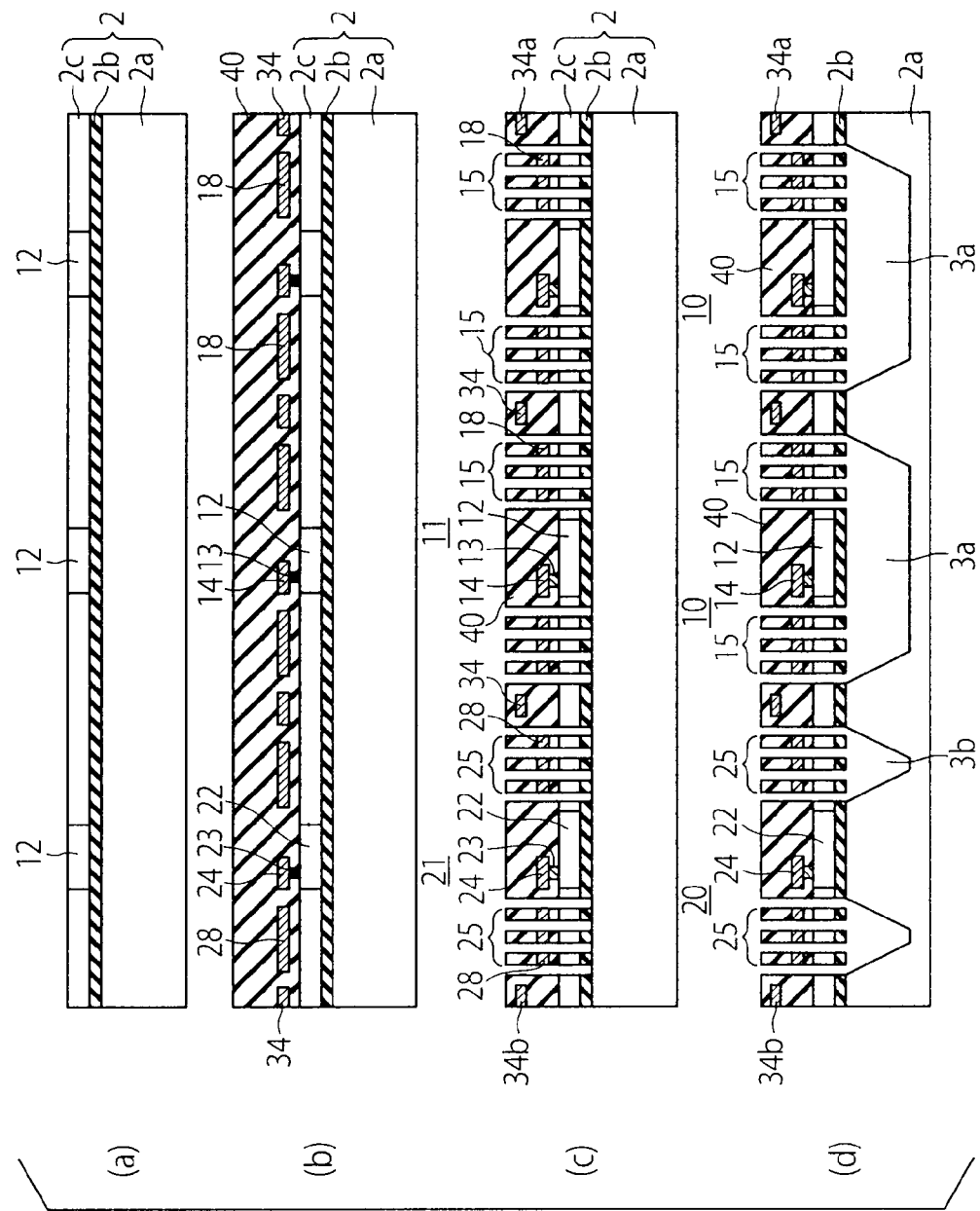
FIGS. 10(a) through 10(d) are cross-sectional views for explaining a method of manufacturing an uncooled infrared image sensor according to a sixth embodiment.

First, the SOI substrate 2 having the supporting substrate 2a, the buried insulating film 2b, and the SOI layer 2c is prepared, and the heat sensitive elements 12 and 22 formed by pn-junction diodes are formed in the SOI layer 2c of the SOI substrate 2 (FIG. 10(a)). The heat sensitive elements 12 are formed in the pixel formation region, and the heat sensitive elements 22 are formed in the reference pixel formation region.

A first infrared absorption film is then formed to cover the surface having the heat sensitive elements 12 and 22 formed therein. Contact holes reaching the heat sensitive elements 12 and 22 are formed in the first infrared absorption film, and the contact holes are filled with a metal, to form contacts 13 and 23. A metal film for forming interconnects is then formed on the first infrared absorption film, and patterning is performed on the metal film, to form interconnects 14, 18, 24, and 34. A second infrared absorption film is then formed to cover the surface having those interconnects 14, 18, 24, and 34 formed therein. The first infrared absorption film and the second infrared absorption film constitute the infrared absorption film 40 (FIG. 10(b)).

Patterning is then performed on the infrared absorption film 40, the interconnects 18 and 28, and the buried insulating film 2b, to form openings reaching the upper face of the supporting substrate 2a. In this manner, the pixel cells 11, the supporting units 15, the reference pixel cells 21, and the interconnect units 25 are separated from one another (FIG. 10(c)). In the reference pixel units 20, openings are not formed in the region of the portions 29 at both ends in the direction in which the heat sensitive elements 22 shown in FIG. 1(a) are connected in series, but openings are formed in the region where the supporting units 25 are formed. In the pixel units 10, on the other hand, openings are formed not only in the region where the supporting units 15 are formed but also in the portions at both ends in the direction in which the head sensitive elements 12 are connected in series.

Etching is then performed on the supporting substrate 2a via the openings by a known method, with the use of an alkaline solution such as TMAH (TetraMethyl Ammonium Hydroxide). Through the etching, the concave portions 3a and 3b are formed in the surface of the supporting substrate 2a, and the infrared image sensor of the first embodiment is formed (FIG. 10(d)). In the reference pixel units 20, openings are not formed in the regions of the portions 29 at both ends in the direction in which the heat sensitive elements 22 are connected in series, but openings are formed in the regions where the supporting units 25 are formed. Accordingly, the concave portions 3b are formed only below the supporting units 25. In the pixel units 10, on the other hand, the concave portions 3a are formed below the pixel cells 11 and the supporting units 15.

In a case where the uncooled infrared image sensor of the fifth embodiment shown in FIGS. 8(a) through 8(d) is manufactured, in the reference pixel units 20, openings are not formed in the regions where the bridges 29a are formed at both ends in the direction in which the heat sensitive elements 22 shown in FIG. 1(a) are connected in series, but openings are formed in the regions where the supporting units 25 are formed. In that case, the width of both ends 29a (the length in the direction perpendicular to the direction in which the heat sensitive elements 22 are connected in series) is smaller than the width of the reference pixel cells 21. Therefore, the concave portions 3b are formed below the portions 29a at both ends.

Next, the variations in the threshold voltages of diode arrays to be used for heat sensitive elements of uncooled infrared image sensors of an embodiment are described. Concave portions are not formed below some of the diode arrays, and concave portions are formed below some of the diode arrays.

Figure 11:
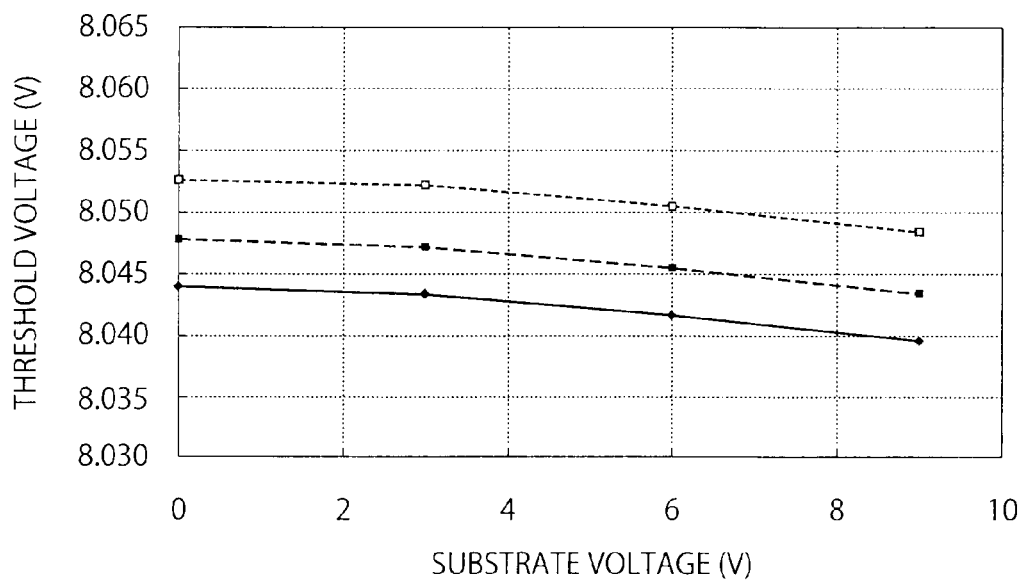
FIG. 11 is a graph showing the substrate voltage dependences of the threshold voltages of diodes below which concave portions are not formed.

First, three diode arrays are formed, and samples that have no concave portions below those diode arrays are prepared. FIG. 11 shows the results of measurement of the substrate voltage dependences of the threshold voltages of the diode arrays in those samples. As can be seen from FIG. 11, where no concave portions are formed, the threshold voltage varies by 4.3 mV to 4.5 mV, as the substrate voltage varies from 0 V to 9 V.

Figure 12:
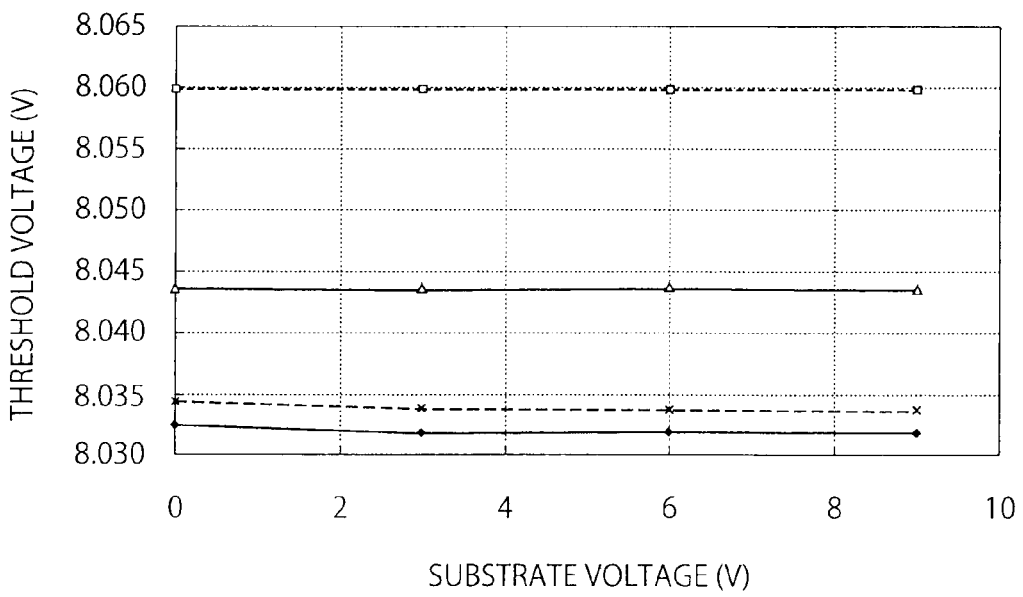
FIG. 12 is a graph showing the substrate voltage dependences of the threshold voltages of diodes below which concave portions are formed.

Next, four diode arrays are formed, and samples that have concave portions formed below those diode arrays are prepared. FIG. 12 shows the results of measurement of the substrate voltage dependences of the threshold voltages of the diode arrays in the samples. As can be seen from FIG. 12, the threshold voltage varies only by 0.1 mV to 0.8 mV, as the substrate voltage varies from 0 V to 9 V. Accordingly, it has become apparent that variations are smaller in the cases where concave portions are formed.

As described so far, according to each of the embodiments, more accurate temperature corrections can be performed on the pixel units.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An uncooled infrared image sensor comprising:
a semiconductor substrate;
a plurality of pixel cells formed in a first region on the semiconductor substrate, the first region having first concave portions arranged in a matrix form in a surface of the semiconductor substrate, the pixel cells corresponding to the arrangement of the first concave portions and being located above the first concave portions, each of the pixel cells including: a first infrared absorption film absorbing an incident infrared ray and converting the absorbed infrared ray into heat; and a first heat sensitive element generating an electrical signal by detecting the heat from the first infrared absorption film;
a reference pixel cell formed in a second region on the semiconductor substrate and corresponding to each row or each column of the pixel cells, the reference pixel cell including: a second infrared absorption film absorbing an incident infrared ray and converting the absorbed infrared ray into heat; and a second heat sensitive element generating an electrical signal by detecting the heat from the second infrared absorption film, the second heat sensitive element having the same characteristics as characteristics of the first heat sensitive element;
a supporting unit formed for each of the pixel cell and supporting a corresponding pixel cell above the first concave portions, the supporting unit including: a first interconnect having one end connected to one end of the first heat sensitive element; and a second interconnect having one end connected to the other end of the first heat sensitive element; and
an interconnect unit formed for each reference pixel cell, the interconnect unit including: a third interconnect having one end connected to one end of the second heat sensitive element; and a fourth interconnect having one end connected to the other end of the corresponding second heat sensitive element,
the third and fourth interconnects of the interconnect unit having the same electrical resistance as electrical resistance of the first and second interconnects,
the reference pixel cell being in contact with the semiconductor substrate,
a second concave portion being formed below the interconnect unit and being located in the surface of the semiconductor substrate.

2. The sensor according to claim 1, wherein the third and fourth interconnects of the interconnect unit have the same shapes as shapes of the first and second interconnects of the supporting unit.

3. The sensor according to claim 1, wherein
the reference pixel cell is formed for each row of the pixel cells,
the uncooled infrared image sensor further comprises:
a row select line formed for each row of the pixel cells, the row select line being connected to the other end of the first interconnect of the supporting unit of the pixel cell on a corresponding row, the row select line being connected to the other end of the third interconnect of the interconnect unit of the reference pixel cell on the corresponding row;
a plurality of first signal lines formed for the respective columns of the pixel cells, each of the first signal lines being connected to the other end of the second interconnect of the supporting unit of the pixel cell on a corresponding column; and
a second signal line connected to the other end of the fourth interconnect of the interconnect unit of the reference pixel cell.

4. The sensor according to claim 1, wherein
the reference pixel cell is formed for each column of the pixel cells,
the uncooled infrared image sensor further comprises:
a reference pixel row select line selecting a row of the reference pixel cell, the reference pixel row select line being connected to the other end of the third interconnect of the interconnect unit corresponding to the reference pixel cell;
a row select line formed for each row of the pixel cells, the row select line being connected to the other end of the first interconnect of the supporting unit of the pixel cell on a corresponding row; and
a plurality of signal lines formed for the respective columns of the pixel cells, each of the signal lines being connected to the other end of the second interconnect of the supporting unit of the pixel cell on a corresponding column, each of the signal lines being connected to the fourth interconnect of the interconnect unit of the reference pixel cell on the corresponding column.

5. An uncooled infrared image sensor comprising:
a semiconductor substrate;
a plurality of pixel cells formed in a first region on the semiconductor substrate, the first region having first concave portions arranged in a matrix form in a surface of the semiconductor substrate, the pixel cells corresponding to the arrangement of the first concave portions and being located above the first concave portions, each of the pixel cells including: a first infrared absorption film absorbing an incident infrared ray and converting the absorbed infrared ray into heat; and a first heat sensitive element generating an electrical signal by detecting the heat from the first infrared absorption film;
a reference pixel cell formed in a second region on the semiconductor substrate and corresponding to each row or each column of the pixel cells, the reference pixel cell including: a second infrared absorption film absorbing an incident infrared ray and converting the absorbed infrared ray into heat; and a second heat sensitive element generating an electrical signal by detecting the heat from the second infrared absorption film, the second heat sensitive element having the same characteristics as characteristics of the first heat sensitive element;
a supporting unit formed for each of the pixel cells and supporting a corresponding pixel cell above the first concave portions, the supporting unit including: a first interconnect having one end connected to one end of the first heat sensitive element; and a second interconnect having one end connected to the other end of the first heat sensitive element; and
an interconnect unit formed for each reference pixel cell, the interconnect unit including: a third interconnect having one end connected to one end of the second heat sensitive element; and a fourth interconnect having one end connected to the other end of the second heat sensitive element,
the third and fourth interconnects of the interconnect unit having the same electrical resistance as electrical resistance of the first and second interconnects, a second concave portion being formed below the reference pixel cell and being located in the surface of the semiconductor substrate, the interconnect unit being in contact with the semiconductor substrate.

6. The sensor according to claim 5, wherein the third and fourth interconnects of the interconnect unit have the same shapes as shapes of the first and second interconnects of the supporting unit.

7. The sensor according to claim 5, wherein the reference pixel cell is formed for each row of the pixel cells, the uncooled infrared image sensor further comprises:

a row select line formed for each row of the pixel cells, the row select line being connected to the other end of the first interconnect of the supporting unit of the pixel cell on a corresponding row, the row select line being connected to the other end of the third interconnect of the interconnect unit of the reference pixel cell on the corresponding row;

a plurality of first signal lines formed for the respective columns of the pixel cells, each of the first signal lines being connected to the other end of the second interconnect of the supporting unit of the pixel cell on a corresponding column; and a second signal line connected to the other end of the fourth interconnect of the interconnect unit of the reference pixel cell.

8. The sensor according to claim 5, wherein the reference pixel cell is formed for each column of the pixel cells, the uncooled infrared image sensor further comprises:

a reference pixel row select line selecting a row of the reference pixel cell, the reference pixel row select line being connected to the other end of the third interconnect of the interconnect unit corresponding to the reference pixel cell;

a row select line formed for each row of the pixel cells, the row select line being connected to the other end of the first interconnect of the supporting unit of the pixel cell on a corresponding row; and a plurality of signal lines formed for the respective columns of the pixel cells, each of the signal lines being connected to the other end of the second interconnect of the supporting unit of the pixel cell on a corresponding column, each of the signal lines being connected to the fourth interconnect of the interconnect unit of the reference pixel cell on the corresponding column.

9. An uncooled infrared image sensor comprising:

a semiconductor substrate;

a plurality of pixel cells formed in a first region on the semiconductor substrate, the first region having first concave portions arranged in a matrix form in a surface of the semiconductor substrate, the pixel cells corresponding to the arrangement of the first concave portions and being located above the first concave portions, each of the pixel cells including: a first infrared absorption film absorbing an incident infrared ray and converting the absorbed infrared ray into heat; and a first heat sensitive element generating an electrical signal by detecting the heat from the first infrared absorption film;

a reference pixel cell formed in a second region on the semiconductor substrate and corresponding to each row or each column of the pixel cells, the reference pixel cell including: a second infrared absorption film absorbing an incident infrared ray and converting the absorbed infrared ray into heat; and a second heat sensitive element generating an electrical signal by detecting the heat from the second infrared absorption film, the second heat sensitive element having the same characteristics as characteristics of the first heat sensitive element;

a supporting unit formed for each of the pixel cells and supporting a corresponding pixel cell above the first concave portions, the supporting unit including: a first interconnect having one end connected to one end of the first heat sensitive element; and a second interconnect having one end connected to the other end of the first heat sensitive element; and an interconnect unit formed for each reference pixel cell, the interconnect unit including: a third interconnect having one end connected to one end of the second heat sensitive element; and a fourth interconnect having one end connected to the other end of the second heat sensitive element, the third and fourth interconnects of the interconnect unit having the same electrical resistance as electrical resistance of the first and second interconnects, a second concave portion being formed below the reference pixel cell and the interconnect unit, the second concave portion being located in the surface of the semiconductor substrate, wherein a heat-conducting bridge is formed between the reference pixel cell and the semiconductor substrate.

10. The sensor according to claim 9, wherein the third and fourth interconnects of the interconnect unit have the same shapes as shapes of the first and second interconnects of the supporting unit.

11. The sensor according to claim 9, wherein the reference pixel cell is formed for each row of the pixel cells, the uncooled infrared image sensor further comprises:

a row select line formed for each row of the pixel cells, the row select line being connected to the other end of the first interconnect of the supporting unit of the pixel cell on a corresponding row, the row select line being connected to the other end of the third interconnect of the interconnect unit of the reference pixel cell on the corresponding row;

a plurality of first signal lines formed for the respective columns of the pixel cells, each of the first signal lines being connected to the other end of the second interconnect of the supporting unit of the pixel cell on a corresponding column; and a second signal line connected to the other end of the fourth interconnect of the interconnect unit of the reference pixel cell.

12. The sensor according to claim 9, wherein the reference pixel cell is formed for each column of the pixel cells, the uncooled infrared image sensor further comprises:

a reference pixel row select line selecting a row of the reference pixel cell, the reference pixel row select line being connected to the other end of the third interconnect of the interconnect unit corresponding to the reference pixel cell;

a row select line formed for each row of the pixel cells, the row select line being connected to the other end of the first interconnect of the supporting unit of the pixel cell on a corresponding row; and a plurality of signal lines formed for the respective columns of the pixel cells, each of the signal lines being connected to the other end of the second interconnect of the supporting unit of the pixel cell on a corresponding column, each of the signal lines being connected to the fourth interconnect of the interconnect unit of the reference pixel cell on the corresponding column.

13. An uncooled infrared image sensor comprising:
a semiconductor substrate;
a pixel cell formed in a first region on the semiconductor substrate, the first region having a first concave portion in a surface of the semiconductor substrate, the pixel cell corresponding to the first concave portion and being located above the first concave portion, the pixel cell including: a first infrared absorption film absorbing an incident infrared ray and converting the absorbed infrared ray into heat; and a first heat sensitive element generating an electrical signal by detecting the heat from the first infrared absorption film;
a reference pixel cell formed in a second region on the semiconductor substrate, the reference pixel cell including: a second infrared absorption film absorbing an incident infrared ray and converting the absorbed infrared ray into heat; and a second heat sensitive element generating an electrical signal by detecting the heat from the second infrared absorption film, the second heat sensitive element having the same characteristics as characteristics of the first heat sensitive element;
a supporting unit supporting the pixel cell above the first concave portions, the supporting unit including: a first interconnect having one end connected to one end of the first heat sensitive element; and a second interconnect having one end connected to the other end of the first heat sensitive element; and
an interconnect unit formed for the reference pixel cell, the interconnect unit including: a third interconnect having one end connected to one end of the second heat sensitive element; and a fourth interconnect having one end connected to the other end of the corresponding second heat sensitive element,
the third and fourth interconnects of the interconnect unit having the same electrical resistance as electrical resistance of the first and second interconnects,
the reference pixel cell being in contact with the semiconductor substrate,
a second concave portion being formed below the interconnect unit and being located in the surface of the semiconductor substrate.

14. An uncooled infrared image sensor comprising:
a semiconductor substrate;
a pixel cell formed in a first region on the semiconductor substrate, the first region having a first concave portion in a surface of the semiconductor substrate, the pixel cell corresponding to the first concave portion and being located above the first concave portion, the pixel cell including: a first infrared absorption film absorbing an incident infrared ray and converting the absorbed infrared ray into heat; and a first heat sensitive element generating an electrical signal by detecting the heat from the first infrared absorption film;
a reference pixel cell formed in a second region on the semiconductor substrate, the reference pixel cell including: a second infrared absorption film absorbing an incident infrared ray and converting the absorbed infrared ray into heat; and a second heat sensitive element generating an electrical signal by detecting the heat from the second infrared absorption film, the second heat sensitive element having the same characteristics as characteristics of the first heat sensitive element;
a supporting unit supporting the pixel cell above the first concave portion, the supporting unit including: a first interconnect having one end connected to one end of the first heat sensitive element; and a second interconnect having one end connected to the other end of the first heat sensitive element; and
an interconnect unit formed for the reference pixel cell, the interconnect unit including: a third interconnect having one end connected to one end of the second heat sensitive element; and a fourth interconnect having one end connected to the other end of the second heat sensitive element,
the third and fourth interconnects of the interconnect unit having the same electrical resistance as electrical resistance of the first and second interconnects,
a second concave portion being formed below the reference pixel cell and being located in the surface of the semiconductor substrate,
the interconnect unit being in contact with the semiconductor substrate.

* * * * *